United States Patent
Mizuta

(10) Patent No.: US 11,309,463 B2
(45) Date of Patent: Apr. 19, 2022

(54) LIGHT EMITTING DEVICE, LIGHT ILLUMINATING MODULE AND LIGHT ILLUMINATING APPARATUS

(71) Applicant: HOYA CANDEO OPTRONICS CORPORATION, Toda (JP)

(72) Inventor: Taiji Mizuta, Toda (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 15/941,506

(22) Filed: Mar. 30, 2018

(65) Prior Publication Data
US 2018/0287023 A1   Oct. 4, 2018

(30) Foreign Application Priority Data
Mar. 31, 2017   (JP) .............................. JP2017-070057

(51) Int. Cl.
| | | |
|---|---|---|
| H01L 33/58 | (2010.01) | |
| H01L 33/54 | (2010.01) | |
| H01L 25/13 | (2006.01) | |
| H01L 25/075 | (2006.01) | |
| H01L 33/20 | (2010.01) | |

(52) U.S. Cl.
CPC .............. *H01L 33/58* (2013.01); *H01L 25/13* (2013.01); *H01L 33/54* (2013.01); *H01L 25/0753* (2013.01); *H01L 33/20* (2013.01); *H01L 2933/005* (2013.01); *H01L 2933/0058* (2013.01)

(58) Field of Classification Search
CPC ......... H01L 33/58; H01L 33/54; H01L 25/13; H01L 25/0753; H01L 33/20; H01L 2933/0058; H01L 2933/005
See application file for complete search history.

(56) References Cited

U.S. PATENT DOCUMENTS

| | | | |
|---|---|---|---|
| 2008/0298055 A1* | 12/2008 | Tanaka .............. | G02F 1/133615 362/231 |
| 2009/0321763 A1* | 12/2009 | Chang ..................... | H01L 33/54 257/98 |
| 2010/0193821 A1* | 8/2010 | Fukasawa ............... | H01L 33/54 257/98 |
| 2011/0222280 A1* | 9/2011 | Kim ........................ | H01L 33/58 362/235 |
| 2012/0267647 A1* | 10/2012 | Kim ........................ | H01L 27/15 257/88 |
| 2018/0178247 A1* | 6/2018 | Aizawa .................. | B05D 3/067 |
| 2020/0176643 A1* | 6/2020 | Pang ....................... | H01L 33/54 |

FOREIGN PATENT DOCUMENTS

| | | |
|---|---|---|
| JP | S58-83166 U | 6/1983 |
| JP | 2004-281605 A | 10/2004 |
| JP | 2006-195124 A | 7/2006 |
| JP | 2009-136796 A | 6/2009 |
| JP | 2011-138815 A | 7/2011 |
| JP | 2013-026605 A | 2/2013 |
| JP | 2013-244727 A | 12/2013 |
| JP | 2014-090055 A | 5/2014 |
| WO | WO 2008-068979 A1 | 6/2008 |
| WO | WO 2011-040136 A1 | 4/2011 |
| WO | WO 2012-073398 A1 | 6/2012 |

* cited by examiner

*Primary Examiner* — Hoang-Quan Ho
(74) *Attorney, Agent, or Firm* — Rabin & Berdo, P.C.

(57) ABSTRACT

A light emitting device includes a substrate, a LED element placed on the substrate, and a lens placed on an optical path of the LED element, wherein the lens has a convex part protruding in a direction of an optical axis of the lens in a central part of an exit surface of the lens.

13 Claims, 8 Drawing Sheets

LIGHT EMITTING DEVICE, LIGHT ILLUMINATING MODULE AND LIGHT ILLUMINATING APPARATUS

TECHNICAL FIELD

The present disclosure relates to a light emitting device with a lens on an optical path of a light emitting diode (LED), a light illuminating module with lenses on each optical path of multiple LEDs, and a light illuminating apparatus with multiple light illuminating modules.

BACKGROUND ART

Conventionally, to cure an ultraviolet (UV) curable resin used as an adhesive around Flat Panel Display (FPD) or a UV curable ink used as an ink for sheet-fed offset printing, a UV light illuminating apparatus is used.

As the UV light illuminating apparatus, a lamp-type illuminating apparatus using a high pressure mercury lamp or a mercury xenon lamp as a light source has been long known, but recently, in keeping with the demand for reduced power consumption, a longer service life, a compact device and environmental regulations, a UV light illuminating apparatus using Light Emitting Diode (LED) as an alternative to a traditional discharge lamp for a light source is developed (for example, Patent Literatures 1 and 2).

The UV light illuminating apparatus disclosed by Patent Literature 1 is a light illuminating module (UV light illuminating apparatus) that is incorporated into a printer using a UV curable ink such as an offset printer or an inkjet printer to cure the UV curable ink, and includes multiple light illuminating devices, each including a substrate having multiple openings, multiple light emitting elements (LEDs) positioned in each opening of the substrate, multiple encapsulants filled in each opening to coat the light emitting elements, and multiple lenses positioned on each light emitting element (i.e., on the optical path) to converge light emitted from each light emitting element. Additionally, the multiple light illuminating devices arranged in a line in widthwise direction of a target move relatively to the target to cure UV curable resin on the target.

Additionally, in the use for curing UV curable resin as above, UV curable resin is likely to be influenced by oxygen inhibition, and to reduce the influence of oxygen inhibition, it is proposed that LEDs with short light emission wavelength are positioned on the upstream side in the movement direction of the target, and LEDs with long light emission wavelength are positioned on the downstream side (for example, Patent Literature 2).

RELATED LITERATURES

Patent Literatures (Patent Literature 1) Japanese Patent Publication No. 2014-090055
(Patent Literature 2) Japanese Patent Publication No. 2013-244727

DISCLOSURE

Technical Problem

As above, in the light illuminating device of Patent Literature 2, multiple types of light emitting diodes (LEDs) are provided on the substrate, and once lenses are attached onto each LED, then it is impossible to identify the type of the LEDs disposed immediately below.

Additionally, when multiple types of LEDs are asymmetrically positioned on the substrate as in Patent Literature 2, the light illuminating device has directionality. That is, there is a need to incorporate into the device body while monitoring the direction of the light illuminating device such that LEDs with short light emission wavelength is positioned on the upstream side in the movement direction of the target, and LEDs with long light emission wavelength is positioned on the downstream side.

To monitor the direction of the light illuminating device, it is general to attach a direction identification mark by installing a cutout at a portion of the substrate or forming a mark on the substrate surface. However, to install a cutout at a portion of the substrate or forming a mark, it is necessary to install a dedicated space in the substrate itself, causing increases in substrate size and device size.

In these circumstances, the present disclosure is directed to providing a light emitting device that can identify the type of LED disposed immediately below a lens without forming a mark on a substrate. Additionally, the present disclosure is directed to providing a light illuminating module that can recognize directionality without forming a mark on a substrate and a light illuminating apparatus with the same.

Technical Solution

To achieve the object, a light emitting device of the present disclosure includes a substrate, a light emitting diode (LED) element placed on the substrate, and a lens placed on an optical path of the LED element, wherein the lens has a convex part protruding in a direction of an optical axis of the lens in a central part of an exit surface of the lens.

By this configuration, the convex part can be used as an identification mark, and thus, the type of the LED element disposed immediately below the lens can be identified from the shape of the convex part.

Additionally, preferably, the lens shows a shape of a hemisphere with an approximately circular cross section in a direction perpendicular to the optical axis, or an elliptical hemisphere with an approximately elliptical cross section in a direction perpendicular to the optical axis. Additionally, in this case, the lens is preferably configured to satisfy the following conditional expression (1) when a maximum diameter of the lens when viewed in a direction of the optical axis is $\phi$ and a diameter of a circumcircle of the convex part is d:

$$d/\phi \leq 0.50 \, d \geq 0.3 \quad (1)$$

Additionally, preferably, the lens shows a shape of a cannonball with an approximately circular or approximately elliptical cross section in a direction perpendicular to the optical axis. Additionally, in this case, the lens is preferably configured to satisfy the following conditional expression (2) when a maximum diameter of the lens when viewed in a direction of the optical axis is $\phi$ and a height of the lens in a direction of the optical axis is T:

$$0.31 \leq T/\phi \leq 0.90 \quad (2)$$

Additionally, the LED element may show an approximately rectangular shape when viewed in a direction of the optical axis, and the lens may be configured to satisfy the following conditional expression (3) when a length of a long side of the LED element is s:

$$0.10 \leq s/\phi \leq 0.60 \quad (3)$$

Additionally, preferably, the convex part protrudes in an approximately circular, approximately elliptical or approximately polygonal shape when viewed in a direction of the optical axis.

Additionally, preferably, the LED element is encapsulated with the lens.

Additionally, preferably, light emitted from the LED element includes a wavelength of ultraviolet region in which ultraviolet curable resin is cured.

In another aspect, a light illuminating module of the present disclosure includes a substrate, multiple LED elements placed on the substrate, M LED elements being one unit, in which M is an integer equal to or greater than 1, and multiple lenses placed on an optical path for each of the M LED elements, wherein each lens has a convex part protruding in a direction of an optical axis of the lens in a central part of an exit surface of the lens. Additionally, in this case, the multiple LED elements may include N types of LED elements with different characteristics, in which N is an integer equal to or greater than 2, and shape of the convex parts may be different depending on the type of the LED elements. Additionally, in this case, the characteristic is preferably a light emission wavelength of the multiple LED elements. By this configuration, even in case that the light illuminating module has directionality, the directionality of the light illuminating module can be recognized from a shape difference of the convex parts.

Additionally, preferably, the lens of the light illuminating module shows a shape of a hemisphere with an approximately circular cross section in a direction perpendicular to the optical axis, or an elliptical hemisphere with an approximately elliptical cross section in a direction perpendicular to the optical axis. Additionally, in this case, preferably, the lens satisfies the following conditional expression (4) when a maximum diameter of the lens when viewed in a direction of the optical axis is $\phi$ and a diameter of a circumcircle of the convex part is d:

$$d/\phi \leq 0.50 \, d \geq 0.3 \quad (4)$$

Additionally, preferably, the lens of the light illuminating module shows a shape of a cannonball with an approximately circular or approximately elliptical cross section in a direction perpendicular to the optical axis. Additionally, in this case, preferably, the lens satisfies the following conditional expression (5) when a maximum diameter of the lens when viewed in a direction of the optical axis is $\phi$ and a height of the lens in a direction of the optical axis is T:

$$0.31 \leq T/\phi \leq 0.90 \quad (5)$$

Additionally, preferably, the M LED elements of the light illuminating module are placed in an approximately rectangular area when viewed in a direction of the optical axis, and the lens satisfies the following conditional expression (6) when a length of a long side of the area is s:

$$0.10 \leq s/\phi \leq 0.60 \quad (6)$$

Additionally, preferably, the convex part of the light illuminating module protrudes in an approximately circular, approximately elliptical or approximately polygonal shape when viewed in a direction of the optical axis.

Additionally, preferably, the M LED elements of the light illuminating module are encapsulated with the lens.

Additionally, preferably, light emitted from the M LED elements of the light illuminating module includes a wavelength of ultraviolet region in which ultraviolet curable resin is cured.

In still another aspect, a light illuminating apparatus of the present disclosure may include multiple light illuminating modules described above.

Advantageous Effects

As above, according to the present disclosure, a light emitting device that can identify the type of light emitting diode (LED) disposed immediately below a lens without forming a mark on a substrate is realized. Additionally, a light illuminating module that can recognize directionality without forming a mark on a substrate and a light illuminating apparatus with the same are realized.

BEST MODE

Figure 1:
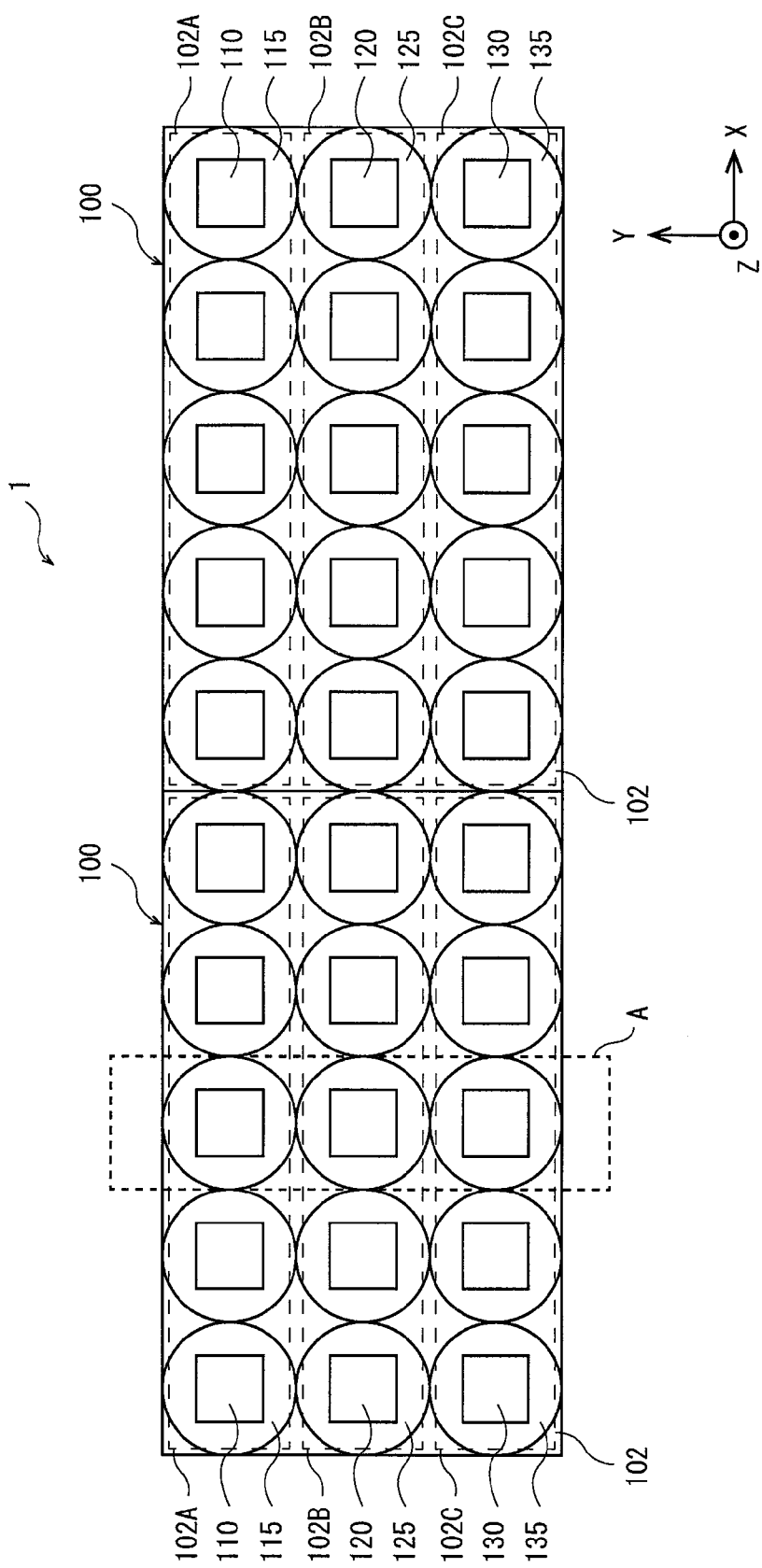
FIG. 1 is a plane view showing configuration of a light illuminating apparatus according to a first embodiment of the present disclosure.

Hereinafter, the embodiments of the present disclosure will be described in detail with reference to the accompanying drawings. Additionally, in the drawings, identical or equivalent elements are given identical reference symbols and their description is not repeated.

First Embodiment (Configuration of a Light Illuminating Apparatus 1)

Figure 2A:
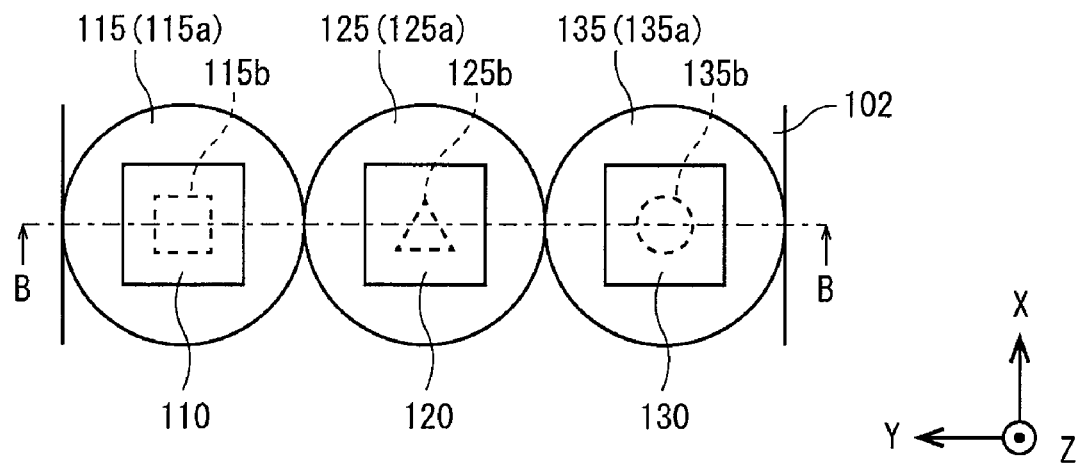
FIGS. 2A and 2B are enlarged detail views of section A in FIG. 1.
Figure 2B:
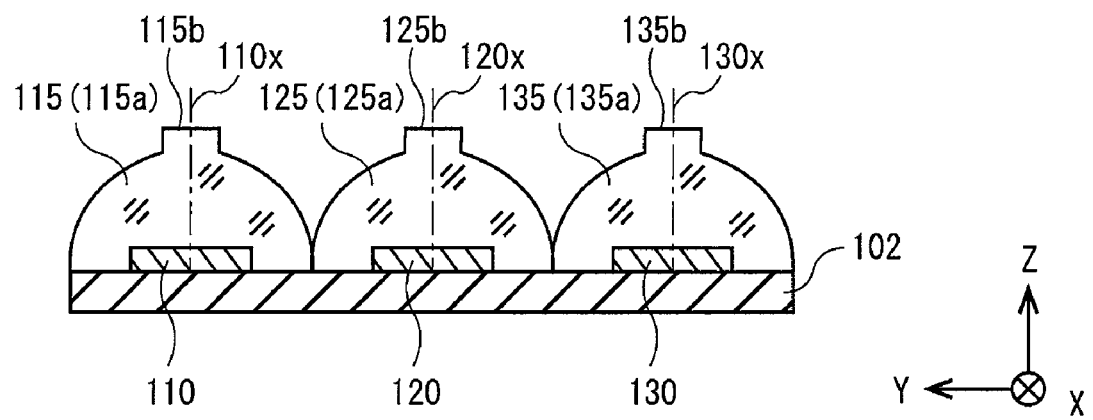

FIG. 1 is a plane view showing configuration of the light illuminating apparatus 1 according to a first embodiment of the present disclosure. Additionally, FIGS. 2A and 2B are enlarged detail views of section A in FIG. 1, FIG. 2A is an enlarged plane view, and FIG. 2B is a cross-sectional view taken along the line B-B of FIG. 2A. The light illuminating apparatus 1 of this embodiment is an apparatus that is incorporated into a printer such as an offset printer or an inkjet printer to emit ultraviolet (UV) light of line shape and cure a UV curable ink on a target, and as shown in FIG. 1, includes multiple light illuminating modules 100. Hereinafter, in the specification, a description is made under the definition of a lengthwise (line length) direction of UV light of line shape emitted from the light illuminating apparatus 1 as an X-axis direction, a widthwise direction (i.e., a vertical direction of FIG. 1) as a Y-axis direction, and a direction perpendicular to the X axis and the Y axis as a Z-axis direction. Additionally, in general, UV light is known as light of wavelength 400 nm or less, and in the specification, UV light refers to light of a wavelength in which UV curable resin can be cured (for example, wavelength 250-420 nm).

(Configuration of the Light Illuminating Module 100)

As shown in FIGS. 1, 2A and 2B, the light illuminating apparatus 1 of this embodiment includes two light illuminating modules 100 arranged in X-axis direction. Additionally, each light illuminating module 100 includes a substrate 102 of a rectangular shape parallel to X-axis direction and Y-axis direction, multiple light emitting diode (LED) elements 110, 120, 130 of three types placed on the substrate 102, and multiple encapsulated lenses 115, 125, 135 each placed on an optical path of each LED element 110, 120, 130.

The substrate 102 of each light illuminating module 100 is a rectangular wiring substrate made of a material with high thermal conductivity (for example, aluminum nitride), and as shown in FIG. 1, the LED elements 110, 120, 130 of square shape are mounted on the surface in 5(X-axis direction)×3(Y-axis direction) array by Chip On Board (COB) technology. More specifically, five LED elements 110 are arranged in a line at a predefined pitch (for example, 3.0 mm) along X-axis direction in an area 102A on Y-axis positive direction side of the substrate 102. Additionally, five LED elements 130 are arranged in a line at a predefined pitch along X-axis direction in an area 102C on Y-axis negative direction side of the surface of the substrate 102, and the LED elements 120 are arranged in a line at a predefined pitch in an area 102B of an approximately central part of the surface of the substrate 102. Additionally, in this embodiment, the Y-axis direction pitch (interval) of the LED elements 110, 120, 130 is set to be approximately equal to the X-axis direction pitch, and the LED elements 110, 120, 130 are arranged in square grid shape.

An anode pattern (not shown) and a cathode pattern (not shown) are formed on the substrate 102 to supply power to each LED element 110, 120, 130, and each LED element 110, 120, 130 is electrically connected to each of the anode pattern and the cathode pattern. A drive current from a general driving circuit is supplied to each LED element 110, 120, 130. When the drive current is supplied to each LED element 110, 120, 130, an amount of UV light is emitted from each LED element 110, 120, 130 in proportion to the drive current, and is irradiated onto a predefined area of a target. Additionally, the LED elements 110, 120, 130 of this embodiment have different light emission wavelengths, and UV light of wavelength 365 nm is emitted from the LED element 110, UV light of wavelength 385 nm is emitted from the LED element 120, and UV light of wavelength 405 nm is emitted from the LED element 130.

Additionally, as shown in FIG. 1, in this embodiment, two light illuminating modules 100 are arranged in X-axis direction, and UV light of three wavelengths emitted from each light illuminating module 100 is each successive in X-axis direction. Additionally, each drive current is adjusted to allow each LED element 110, 120, 130 of this embodiment to emit an approximately uniform amount of UV light, and UV light of three wavelengths emitted from the two light illuminating modules 100 each has an approximately uniform light quantity distribution in X-axis direction.

As shown in FIGS. 2A and 2B, the encapsulated lenses 115, 125, 135 are lens members that are placed on the optical path of each LED element 110, 120, 130 to have a common optical axis with optical axes 110x, 120x, 130x of each LED element 110, 120, 130, and encapsulate the LED elements 110, 120, 130 as well as provide orientation to UV light emitted from each LED element 110, 120, 130. The encapsulated lenses 115, 125, 135 use a resin material with light transmission characteristics, and encapsulate each LED element 110, 120, 130 to prevent the water ingress from the external environment or absorb external impacts, thereby protecting the LED elements 110, 120, 130 well. Additionally, the encapsulated lenses 115, 125, 135 of this embodiment may use, for example, two-component mixed thermal curing type resin, and more specifically, may employ Dow Corning Toray:JCR-6140, OE6085, Shin-Etsu Kagaku: LPS3419, Momentive:IVS4622, etc.

The encapsulated lenses 115, 125, 135 of this embodiment show a hemispherical shape with an approximately circular cross section in a direction perpendicular to the optical axes 110x, 120x, 130x respectively, and are configured to allow UV light emitted from each LED element 110, 120, 130 to pass through the encapsulated lenses 115, 125, 135. Additionally, convex parts 115b, 125b, 135b protruding in Z-axis direction (optical axis direction) are formed at an approximately central part (i.e., a vertex part) of an exit surface 115a, 125a, 135a of each encapsulated lens 115, 125, 135. The convex parts 115b, 125b, 135b are portions that act as an identification mark for identifying the LED elements 110, 120, 130 respectively, and as indicated by the dashed line in FIG. 2A, in this embodiment, the convex part 115b protrudes in square pillar shape, the convex part 125b protrudes in triangular pillar shape, and the convex part 135b protrudes in cylindrical shape.

As above, in this embodiment, because the encapsulated lenses 115, 125, 135 have the convex parts 115b, 125b, 135b acting as an identification mark, even after the encapsulated lenses 115, 125, 135 are attached, the type of LED disposed immediately below can be identified from the shape of the convex parts 115b, 125b, 135b. Additionally, the light illuminating module 100 of this embodiment has three types of LED elements 110, 120, 130 with different wavelengths in Y-axis direction, resulting in asymmetry in Y-axis direction and directionality, and thus directionality of the light illuminating module 100 can be recognized from a shape difference of the convex parts 115b, 125b, 135b. Accordingly, in an attachment process of the light illuminating module 100, an incorrect attachment posture (i.e., direction) of the light illuminating module 100 is prevented.

Additionally, the convex parts 115b, 125b, 135b of this embodiment are formed at the vertex part of the exit surfaces 115a, 125a, 135a, and have little influence on the characteristics of the encapsulated lenses 115, 125, 135 (i.e., an amount of UV light emitted from the encapsulated lenses 115, 125, 135, etc.). FIGS. 3A, 3B, 4A and 4B are diagrams showing the results of simulation carried out by the inventor in review of the influence of the convex parts 115b, 125b, 135b of this embodiment. Additionally, in this embodiment, because the LED elements 110, 120, 130 have the same shape and the same size and the encapsulated lenses 115, 125, 135 have the same shape and the same size, simulation is representatively carried out on the LED element 110 and the encapsulated lens 115 in FIGS. 3A, 3B, 4A and 4B.

Figure 3A:
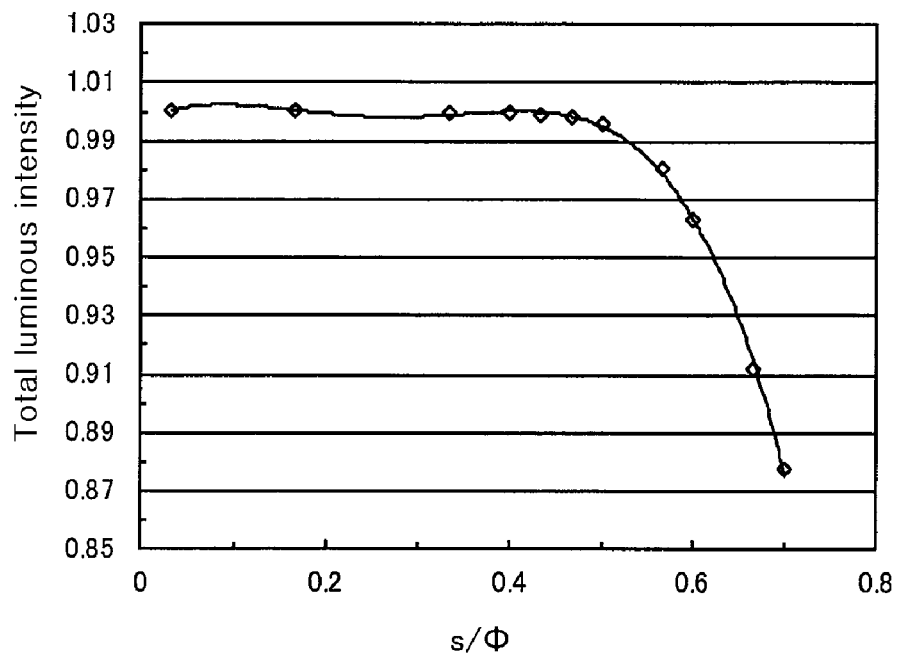
FIGS. 3A and 3B are diagrams showing a relationship between the size s of a light emitting diode (LED) element and the lens diameter $\phi$ of an encapsulated lens provided in a light illuminating apparatus according to a first embodiment of the present disclosure.
Figure 3B:
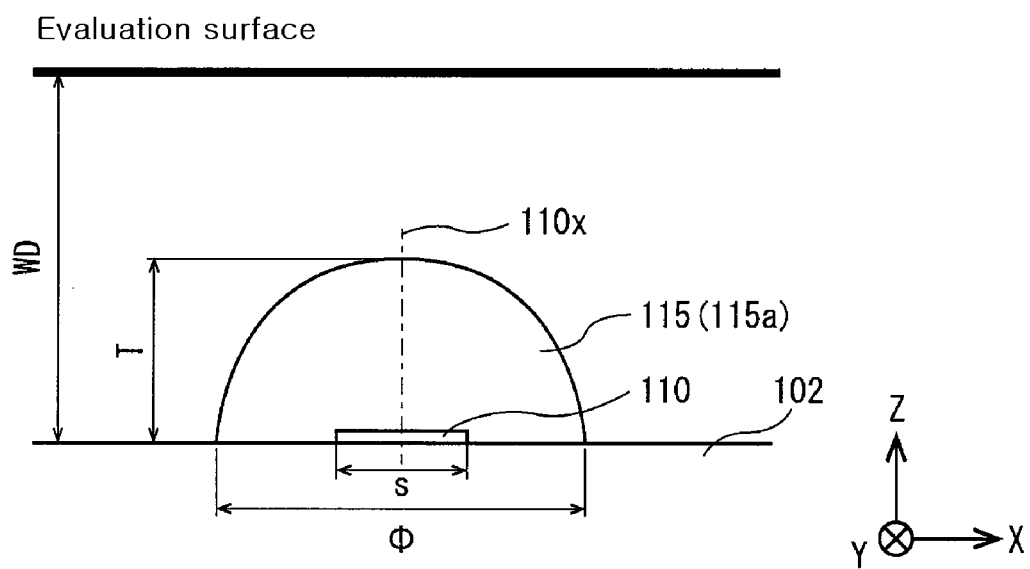

FIGS. 3A and 3B are diagrams showing a relationship between the size in X-axis direction and Y-axis direction (i.e., the length s of one side) of the LED element 110 and the lens diameter φ of the encapsulated lens 115 (i.e., the maximum diameter of the encapsulated lens 115 when viewed in the direction of the optical axis 110x), FIG. 3A is a graph showing a relationship between the size s of the LED element 110 to the lens diameter φ of the encapsulated lens 115 (i.e., s/φ) and the total amount of light, and FIG. 3B is a diagram showing a simulation model of FIG. 3A. Additionally, in FIG. 3A, the vertical axis is a relative value on the basis of the total amount of light when there is no encapsulated lens 115.

As shown in FIG. 3B, in the simulation of FIG. 3A, given that the encapsulated lens 115 has a hemispherical shape, the lens diameter φ of the encapsulated lens 115 is 3 mm, the height T of the encapsulated lens 115 is 1.5 mm, and the size s of the LED element 110 varies in the range of 0.10-2.10 mm, simulation is carried out for the total amount of light at a location of the distance (WD):5 mm from the exit surface of the LED element 110 to an evaluation surface for evaluation of the total amount of light. Additionally, the lens diameter φ of the encapsulated lens 115 is a diameter with respect to the optical axis of the encapsulated lens 115 (i.e., the optical axis 110x of the LED element 110), and in this embodiment, refers to a diameter on the substrate 102 (i.e., on the XY plane).

As shown in FIG. 3A, as s/φ increases (i.e., the size s of the LED element 110 increases for the lens diameter φ of the encapsulated lens 115), the total amount of light reduces. By this reason, to maintain the total amount of light (relative value):95% or more (i.e., for a relationship between the size s of the LED element 110 and the lens diameter φ of the encapsulated lens 115 having no influence on the total amount of light), it can be seen that there is a need to satisfy the following conditional expression (1).

$$0.10 \leq s/\phi \leq 0.60 \quad (1)$$

Figure 4A:
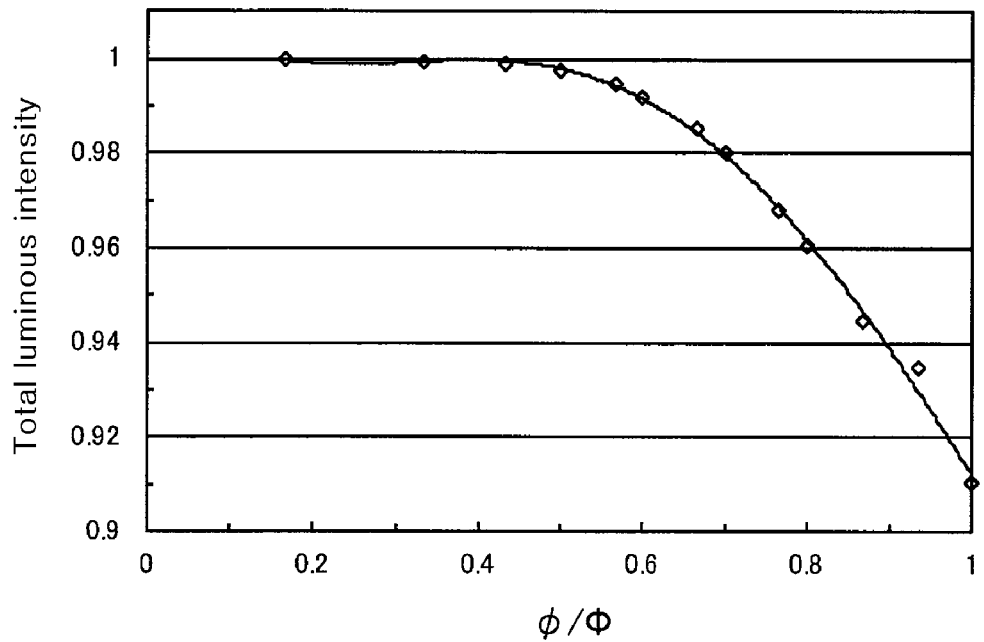
FIGS. 4A and 4B are diagrams showing a relationship between the lens diameter $\phi$ of an encapsulated lens and the diameter d of a convex part provided in a light illuminating apparatus according to a first embodiment of the present disclosure.
Figure 4B:
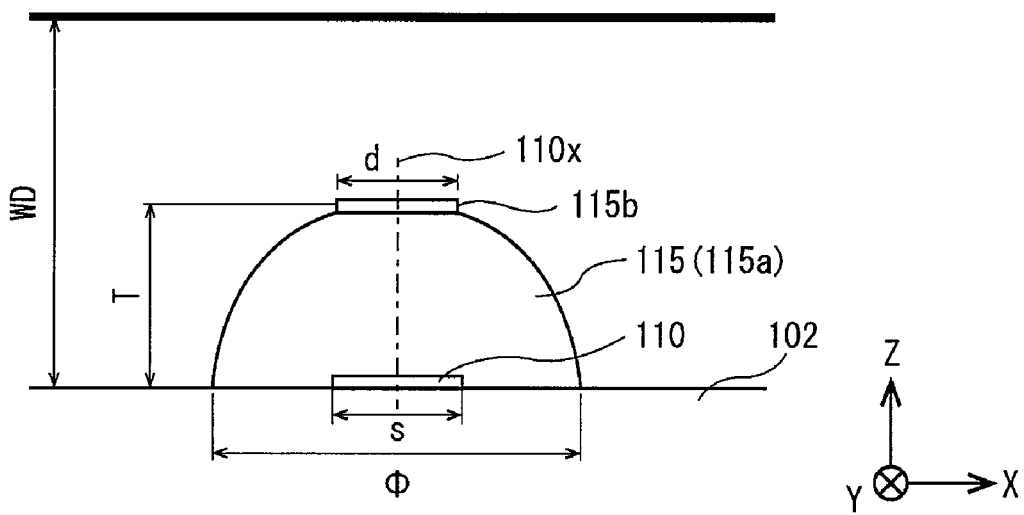

FIGS. 4A and 4B are diagrams showing a relationship between the lens diameter φ of the encapsulated lens 115 and the diameter d of the convex part 115b, FIG. 4A is a graph showing a relationship between the diameter d of the convex part 115b to the lens diameter φ of the encapsulated lens 115 and the total amount of light, and FIG. 4B is a diagram showing a simulation model of FIG. 4A. Additionally, in FIG. 4A, the vertical axis is a relative value on the basis of the total amount of light when the exit surface 115a of the encapsulated lens 115 is an approximately spherical surface.

As shown in FIG. 4B, in the simulation of FIG. 4A, given that the encapsulated lens 115 has a hemispherical shape, the lens diameter φ of the encapsulated lens 115 is 3 mm, the height T of the encapsulated lens 115 is 1.5 mm, and the size s of the LED element 110 is 1 mm, and the diameter d of the convex part 115b varies in the range of 0.50-3.00 mm, simulation is carried out for the total amount of light at a location of the distance (WD):5 mm from the exit surface of the LED element 110 to an evaluation surface for evaluation of the total amount of light. Additionally, the convex part 115b of this embodiment is in square pillar shape, and when the convex part 115b is enough small against the lens diameter φ, the shape has little influence on the total amount of light, so in this embodiment, simulation is carried out on the convex part 115b of cylindrical shape. That is, the diameter d of the convex part 115b denotes a diameter of a circumcircle of the convex part 115b with respect to the optical axis of the encapsulated lens 115 (i.e., the optical axis 110x of the LED element 110).

As shown in FIG. 4A, it can be seen that when d/φ (i.e., the diameter d of the convex part 115b to the lens diameter φ of the encapsulated lens 115) is greater than 0.50, the total amount of light reduces. By this reason, it can be seen that a relationship between the lens diameter φ of the encapsulated lens 115 and the diameter d of the convex part 115b having no influence on the total amount of light needs to satisfy the following conditional expression (2).

$$d/\phi \leq 0.50 \, d \geq 0.3 \quad (2)$$

Additionally, because the convex part 115b acts as an identification mark, from the perspective of visibility, the lower limit of d is 0.3 in the conditional expression (2).

As above, the convex parts 115b, 125b, 135b of this embodiment are configured to satisfy the conditional expression (2) and have little influence on the characteristics of the encapsulated lenses 115, 125, 135 (i.e., an amount of UV light emitted from the encapsulated lenses 115, 125, 135, etc.).

(Method for Molding the Encapsulated Lenses 115, 125, 135)

Subsequently, a method for molding the encapsulated lenses 115, 125, 135 of this embodiment will be described. The method for molding the encapsulated lenses 115, 125, 135 of this embodiment includes known methods allowing thermal curing, such as insert molding, vacuum molding, compression molding and the like.

Figure 5:
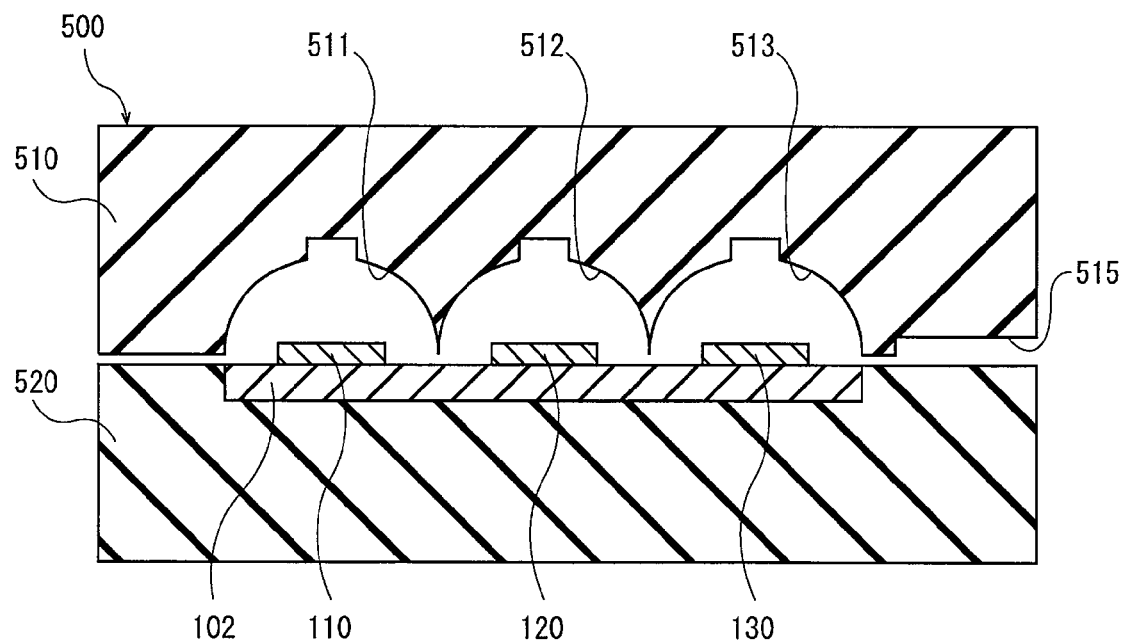
FIG. 5 is a schematic diagram illustrating molding of an encapsulated lens of a light illuminating apparatus according to a first embodiment of the present disclosure by insert molding.

FIG. 5 is a schematic diagram illustrating molding of the encapsulated lenses 115, 125, 135 of this embodiment by insert molding. As shown in FIG. 5, a mold 500 for molding the encapsulated lenses 115, 125, 135 includes a cavity 510 with a molding surface 511, 512, 513 of each encapsulated lens 115, 125, 135, and a core 520 in which the substrate 102 is received.

In the molding process of the encapsulated lenses 115, 125, 135, the substrate 102 having the LED elements 110, 120, 130 mounted thereon is set in the core 520 first. Additionally, the core 520 and the cavity 510 are aligned and screwed, and their joined part is sealed with a sealant. Subsequently, a resin material is injected from a resin inlet 515 formed between the cavity 510 and the core 520. Additionally, the mold 500 is heated and cured at the cure temperature (for example, 150° C.) of the resin. After curing, the core 520 and the cavity 510 are separated and released to obtain the encapsulated lenses 115, 125, 135 (i.e., complete the light illuminating module 100).

While this embodiment has been hereinabove described, the present disclosure is not limited to the foregoing, and various modifications may be made in the scope of the technical spirit of the present disclosure.

For example, although this embodiment describes that the encapsulated lenses 115, 125, 135 have the convex parts 115b, 125b, 135b acting as an identification mark, the present disclosure is not limited thereto. For example, a general condensing lens may be installed on the optical path of each LED element 110, 120, 130, and the convex part acting as an identification mark may be installed on the exit surface of the condensing lens.

Additionally, although in this embodiment, the convex part 115b protrudes in square pillar shape, the convex part 125b protrudes in triangular pillar shape, and the convex part 135b protrudes in cylindrical shape, the shape of the convex part is not limited thereto, and may include various shapes in the range of satisfying the conditional expression (2). That is, after being inscribed in a circle with the diameter d, the convex parts 115b, 125b, 135b may be each formed in different polygonal shapes or elliptical shapes with the diameter d of the long side. Additionally, each convex part 115b, 125b, 135b does not need to have a pillar shape, and for example, may have a shape with a gradual reduction (or increase) in outer diameter such as a cone or a truncated cone.

Additionally, although the encapsulated lenses 115, 125, 135 of this embodiment show a hemispherical shape with an approximately circular cross section in a direction perpendicular to the optical axes 110x, 120x, 130x respectively, the present disclosure is not limited thereto, and for example, the encapsulated lenses 115, 125, 135 may have a shape of elliptical hemisphere with an approximately elliptical cross section in a direction perpendicular to the optical axes 110x, 120x, 130x. Additionally, in this case, the above conditional expressions (1) and (2) may be applied in which the maximum diameter of each encapsulated lens 115, 125, 135 (i.e., the major axis of the encapsulated lenses 115, 125, 135 of elliptical shape) when viewed in the direction of the optical axes 110x, 120x, 130x is φ.

Additionally, although this embodiment describes that each LED element 110, 120, 130 is in square shape, each LED element 110, 120, 130 may be in rectangular shape with different sizes in X-axis direction and Y-axis direction. Additionally, in this case, the above conditional expression (1) may be applied in which the length of the long side of each LED element 110, 120, 130 is s.

Additionally, although it is described that the light illuminating apparatus 1 of this embodiment is incorporated into a printer such as an offset printer or an inkjet printer to emit UV light of line shape, the use of the light illuminating apparatus 1 is not limited thereto, and the light illuminating apparatus 1 of the present disclosure may be used for UV curing or sterilization. Additionally, the light illuminating apparatus 1 may be configured to emit visible light. Additionally, the light illuminating apparatus 1 of this embodiment may be configured to illuminate a predefined spot or a predefined area.

Additionally, although the light illuminating apparatus 1 of this embodiment includes two light illuminating modules 100, the present disclosure is not limited thereto. For example, the light illuminating apparatus 1 may include one light illuminating module 100, and may include N (N is an integer equal to or greater than 2) light illuminating modules 100.

Additionally, although it is described that each LED element 110, 120, 130 of this embodiment has different wavelengths, the present disclosure is not necessarily limited thereto, and for example, each LED element 110, 120, 130 may have different specifications, characteristics or arrangements such as the pitch of the elements, the size of the elements, the array of the elements (a square grid, etc.), the type of the elements (V chips, H chips, flip chips, etc.), light emission output, forward direction voltage rank, optical output rank, etc. In this case, the convex parts 115b, 125b, 135b of the encapsulated lenses 115, 125, 135 act as an identification mark for identifying the specification, characteristic or arrangement. Additionally, each LED element 110, 120, 130 may be placed on different types of substrates. In this case, the convex parts 115b, 125b, 135b of the encapsulated lenses 115, 125, 135 act as an identification mark for identifying the type of the substrate (a glass epoxy substrate, an aluminum substrate, a ceramic substrate, etc.).

Figure 6:
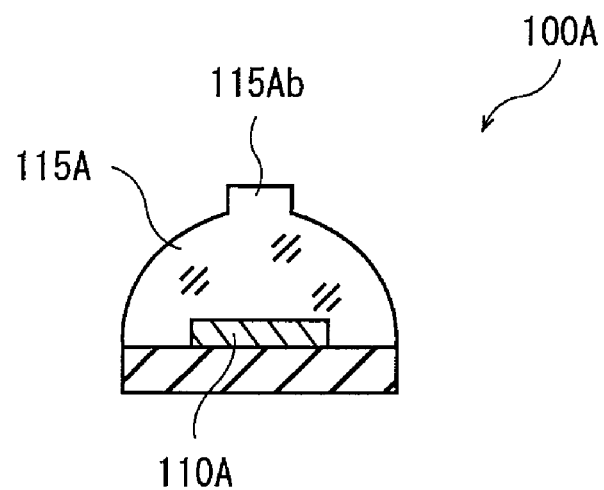
FIG. 6 is a diagram showing a variation of a light illuminating module of a light illuminating apparatus according to a first embodiment of the present disclosure.

Additionally, although in the light illuminating module 100 of this embodiment, the LED elements 110, 120, 130 are mounted in 5(X-axis direction)×3(Y-axis direction) array, the present disclosure is not limited thereto. For example, as shown in FIG. 6, the present disclosure may be applied to a light emitting device 100A having one LED element 110A encapsulated with an encapsulated lens 115A. In this case, in the same way as this embodiment, because the encapsulated lens 115A has a convex part 115Ab acting as an identification mark, even after the encapsulated lens 115A is attached, the type of the LED disposed immediately below can be identified from the shape of the convex part 115Ab, and incorrectly picking up other LED element taken for the LED element 110A may be prevented.

Second Embodiment (Configuration of a Light Illuminating Apparatus 2)

Figure 7A:
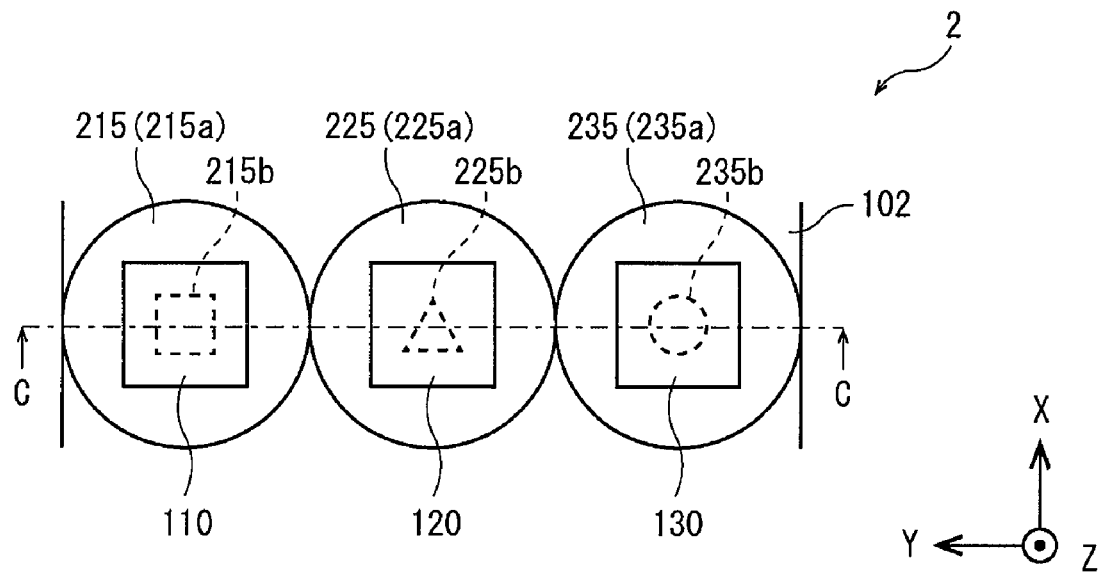
FIGS. 7A and 7B are diagrams showing configuration of a light illuminating apparatus according to a second embodiment of the present disclosure.
Figure 7B:
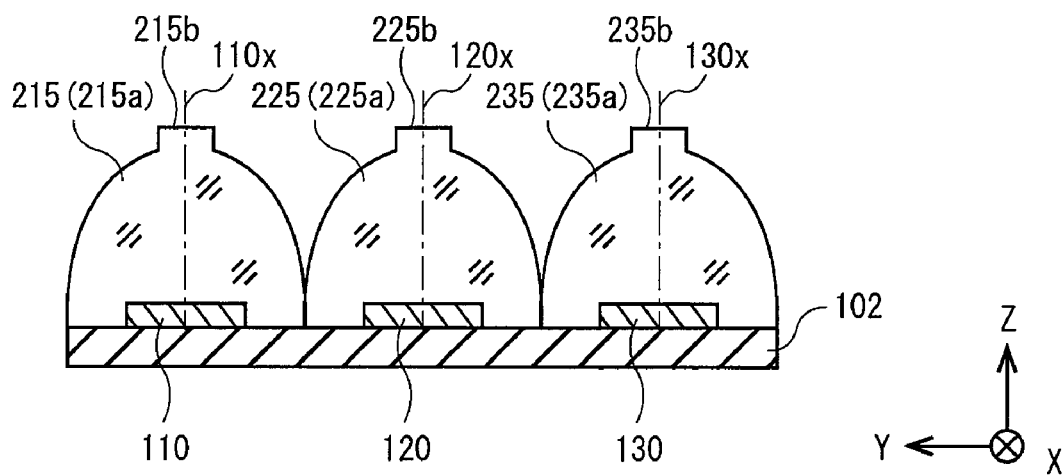

FIGS. 7A and 7B are diagrams showing configuration of the light illuminating apparatus 2 according to a second embodiment of the present disclosure, FIG. 7A is an enlarged plane view, and FIG. 7B is a cross-sectional view taken along the line C-C of FIG. 7A. As shown in FIGS. 7A and 7B, the light illuminating apparatus 2 of this embodiment is different from the light illuminating apparatus 1 of the first embodiment in that each of encapsulated lenses 215, 225, 235 shows a cannonball shape. In this embodiment, as UV light emitted from each LED element 110, 120, 130 passes through the encapsulated lenses 215, 225, 235, the beam angle reduces and orientation in Z-axis direction is provided (i.e., an amount of light going toward Z-axis direction increases). Additionally, convex parts 215b, 225b, 235b protruding in Z-axis direction (optical axis direction) are formed at an approximately central part (i.e., a vertex part) of an exit surface 215a, 225a, 235a of each encapsulated lens 215, 225, 235, and each acts as an identification mark for identifying each LED element 110, 120, 130. Additionally, as indicated by the dashed line in FIG. 7A, in this embodiment, the convex part 215b protrudes in square pillar shape, the convex part 225b protrudes in triangular pillar shape, and the convex part 235b protrudes in cylindrical shape.

Figure 8A:
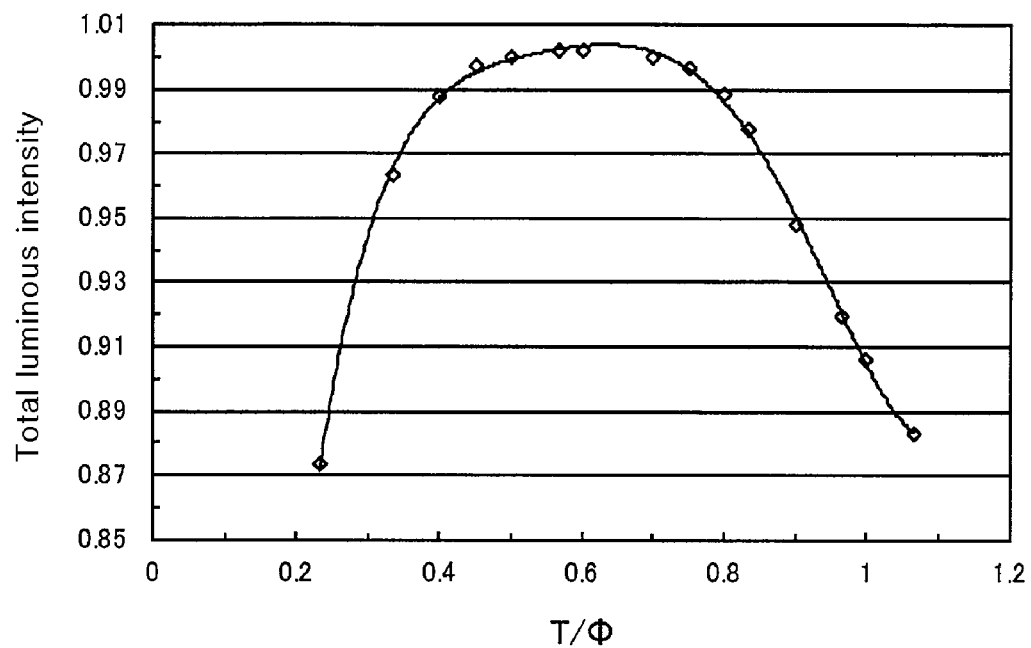
FIGS. 8A and 8B are diagrams showing a relationship between the lens diameter $\phi$ and the height T of an encapsulated lens provided in a light illuminating apparatus according to a second embodiment of the present disclosure.
Figure 8B:
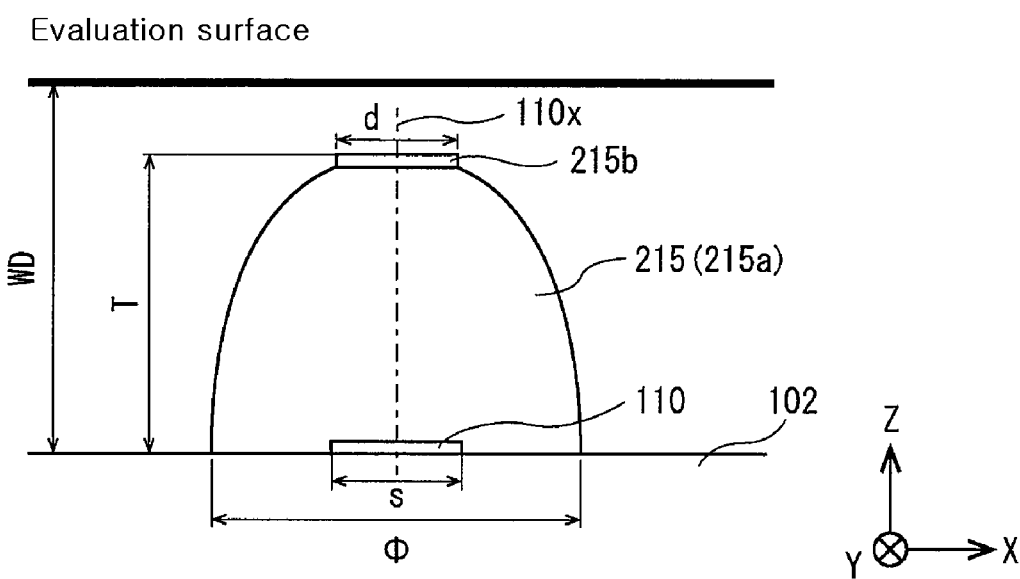

FIGS. 8A and 8B are diagrams showing the results of simulation carried out by the inventor in review of the influence of the convex parts 215b, 225b, 235b of this embodiment, and FIG. 8A is a graph showing a relationship between the height T of the encapsulated lens 215 to the lens diameter φ of the encapsulated lens 215 (i.e., an aspect ratio of the encapsulated lens 215) and the total amount of light. Additionally, FIG. 8B is a diagram showing a simulation model of FIG. 8A. Additionally, in this embodiment, because the LED elements 110, 120, 130 have the same shape and the same size and the encapsulated lenses 215, 225, 235 have the same shape and the same size, simulation is representatively carried out on the LED element 110 and the encapsulated lens 215 in FIGS. 8A and 8B. Additionally, in FIG. 8A, the vertical axis is a relative value on the basis of the total amount of light when the exit surface 215a of the encapsulated lens 215 is an approximately spherical surface.

As shown in FIG. 8B, in the simulation of FIG. 8A, given that the encapsulated lens 215 has a cannonball shape with an approximately circular cross section in a direction perpendicular to the optical axis 110x, the lens diameter φ of the encapsulated lens 215 is 3 mm, the diameter d of the convex part 215b is 1 mm, the size s of the LED element 110 is 1 mm, and the height T of the encapsulated lens 215 varies in the range of 0.70-3.20 mm, simulation is carried out for the total amount of light at a location of the distance WD:5 mm from the exit surface of the LED element 110 to an evaluation surface for evaluation of the total amount of light. Additionally, the convex part 215b of this embodiment is in square pillar shape, and when the convex part 215b is enough small against the lens diameter ϕ, the shape has little influence on the total amount of light, so in this embodiment, simulation is carried out on the convex part 215*b* of cylindrical shape. That is, the diameter d of the convex part 215*b* denotes a diameter of a circumcircle of the convex part 215*b* with respect to the optical axis of the encapsulated lens 215 (i.e., the optical axis 110*x* of the LED element 110).

As shown in FIG. 8A, it can be seen that the total amount of light peaks at T/ϕ (i.e., the height T of the encapsulated lens 215 to the lens diameter ϕ of the encapsulated lens 215) of 0.60, and then drops. By this reason, to maintain the total amount of light (relative value):95% or more, it can be seen that there is a need to satisfy the following conditional expression (3).

$$0.31 \leq T/\phi \leq 0.90 \qquad (3)$$

As above, in case that each of the encapsulated lenses 215, 225, 235 shows a cannonball shape, when each of the encapsulated lenses 215, 225, 235 is configured to satisfy the conditional expression (3), even though the convex parts 215*b*, 225*b*, 235*b* are installed, it can be seen that the convex parts 215*b*, 225*b*, 235*b* have little influence on the characteristics of the encapsulated lenses 215, 225, 235 (i.e., an amount of UV light emitted from the encapsulated lenses 215, 225, 235, etc.).

Additionally, the encapsulated lenses 215, 225, 235 of this embodiment may have a shape of elliptical hemisphere with an approximately elliptical cross section in a direction perpendicular to the optical axes 110*x*, 120*x*, 130*x* in the same way as the first embodiment. Additionally, in this case, the conditional expression (3) may be applied in which the maximum diameter (i.e., the major axis of the encapsulated lenses 215, 225, 235 of ellipse shape) of each encapsulated lens 215, 225, 235 when viewed in the direction of the optical axes 110*x*, 120*x*, 130*x* is ϕ.

Third Embodiment (Configuration of a Light Illuminating Apparatus 3)

Figure 9A:
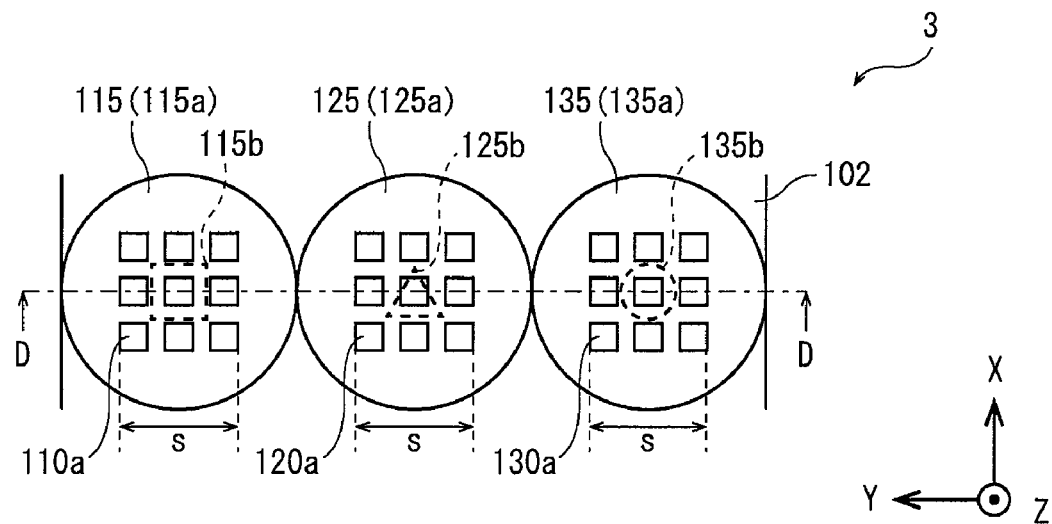
FIGS. 9A and 9B are diagrams showing configuration of a light illuminating apparatus according to a third embodiment of the present disclosure.
Figure 9B:
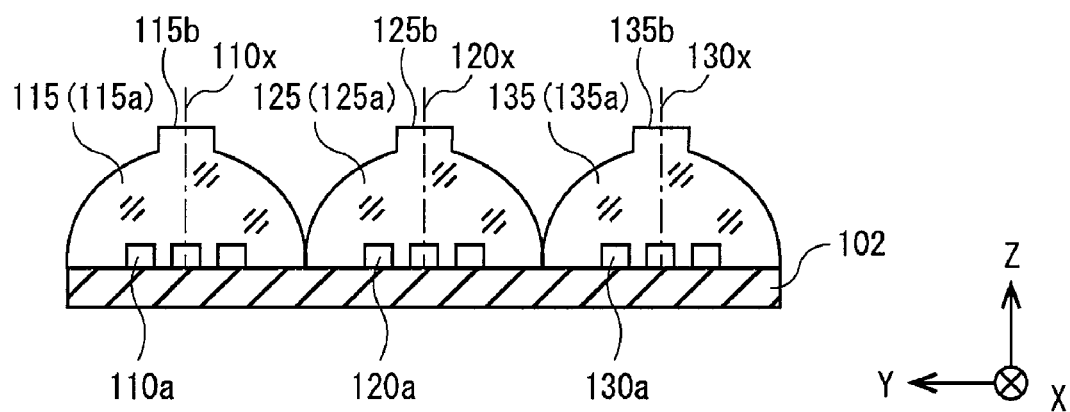

FIGS. 9A and 9B are diagrams showing configuration of the light illuminating apparatus 3 according to a third embodiment of the present disclosure, FIG. 9A is an enlarged plane view, and FIG. 9B is a cross-sectional view taken along the line D-D of FIG. 9A. As shown in FIGS. 9A and 9B, the light illuminating apparatus 3 of this embodiment is different from the light illuminating apparatus 1 of the first embodiment in that the encapsulated lenses 115, 125, 135 is configured to encapsulate multiple (in this embodiment, 3(X-axis direction)×3(Y-axis direction)) LED elements 110*a*, 120*a*, 130*a*, respectively, placed in a predefined rectangular area as one unit. In this embodiment, likewise, as UV light emitted from each LED element 110*a*, 120*a*, 130*a* passes through the encapsulated lenses 115, 125, 135, the beam angle reduces and orientation in Z-axis direction is provided (i.e., an amount of light going toward Z-axis direction increases).

Additionally, in this embodiment, although every nine LED elements 110*a*, 120*a*, 130*a* are encapsulated as one unit, the number of LED elements 110*a*, 120*a*, 130*a* is arbitrary. That is, taking configuration of the first embodiment and configuration of the third embodiment into account, the present disclosure is not limited to the number of LED elements 110*a*, 120*a*, 130*a*, and may be applied to encapsulation of every M (M is an integer equal to or greater than 1) LED elements 110*a*, 120*a*, 130*a* as one unit. Additionally, the above conditional expression (1) may be generalized in which the length of the long side of a rectangular area, where M LED elements 110*a*, 120*a*, 130*a* are positioned, is s.

Furthermore, it should be understood that the disclosed embodiments are illustrative in all aspects and are not limitative. The scope of the present disclosure is defined by the appended claims rather than the foregoing description, and is intended to cover all changes within the meaning and scope equivalent to the appended claims.

DETAILED DESCRIPTION OF MAIN ELEMENTS

1, 2, 3 . . . Light illuminating apparatus
100 . . . Light illuminating module
100A . . . Light emitting device
102 . . . Substrate
110, 120, 130, 110A, 110*a*, 120*a*, 130*a* . . . LED element
110*x*, 120*x*, 130*x* . . . Optical axis
115, 125, 135, 115A, 215, 225, 235 . . . Encapsulated lens
115*a*, 125*a*, 135*a*, 215*a*, 225*a*, 235*a* . . . Exit surface
115*b*, 125*b*, 135*b*, 115A*b*, 215*b*, 225*b*, 235*b* . . . Convex part
500 . . . Mold
510 . . . Cavity
511, 512, 513 . . . Molding surface
515 . . . Resin inlet
520 . . . Core

The invention claimed is:

1. A light emitting device, comprising:
a substrate;
multiple LED elements on the substrate, M LED elements being one unit, in which M is an integer greater than 1; and
multiple lenses on the substrate, such than an optical path of each of the M LED elements passes through a respective lens among the multiple lenses,
wherein the M LED elements are encapsulated in each of the multiple lenses,
wherein each of the multiple lenses has a convex part that acts as an identification mark for identifying the M LED elements encapsulated in each of the multiple lens, the convex part being formed in a central part of an outer surface of each of the multiple lens and protruding in a direction of an optical axis of each of the multiple lenses, and
wherein a shape of the convex part varies according to a type of the M LED elements in each of the multiple lenses, such that the type of the M LED elements is identifiable based on the shape of the respective convex part,
wherein, when viewed in the direction of the optical axis, the convex part of each of the multiple lenses is entirely disposed within an outer periphery of each of the multiple lenses.

2. The light emitting device according to claim 1, wherein the multiple LED elements include N types of LED elements with different characteristics, in which N is an integer equal to or greater than 2.

3. The light illuminating module according to claim 2, wherein the characteristic is a light emission wavelength of the multiple LED elements.

4. The light illuminating module according to claim 1, wherein one of the multiple lenses has a shape of a hemisphere with an approximately circular cross section in a direction perpendicular to the optical axis, or an elliptical hemisphere with an approximately elliptical cross section in a direction perpendicular to the optical axis.

5. The light illuminating module according to claim 4, wherein said one of the multiple lenses satisfies the following conditional expression (4) when a maximum diameter of said one of the multiple lenses when viewed in the direction of the optical axis is $\Phi$ and a diameter of a circumcircle of the convex part is d:

$$d/\Phi \leq 0.50, d \geq 0.3mm \tag{4}$$

6. The light illuminating module according to claim 1, wherein one of the multiple lenses has a shape of a cannonball with an approximately circular or approximately elliptical cross section in a direction perpendicular to the optical axis.

7. The light illuminating module according to claim 6, wherein said one of the multiple lenses satisfies the following conditional expression (5) when a maximum diameter of said one of the multiple lenses when viewed in the direction of the optical axis is $\Phi$ and a height of said one of the multiple lenses in the direction of the optical axis it T:

$$0.31 \leq T/\Phi \leq 0.90 \tag{5}$$

8. The light illuminating module according to claim 5, wherein the M LED elements of each respective LED unit are arranged in a rectangular area when viewed in the direction of the optical axis, and each of the multiple lenses satisfies the following conditional expression (6) when a length of a long side of the area is s:

$$0.10 \leq s/\Phi \leq 0.60 \tag{6}$$

9. The light illuminating module according to claim 1, wherein the convex part of each of the multiple lenses protrudes in an approximately circular, approximately elliptical or approximately polygonal shape when viewed in the direction of the optical axis of each of the multiple lenses.

10. The light illuminating module according to claim 1, wherein the M LED elements are configured to emit light having a wavelength in the ultraviolet region of light capable of curing ultraviolet curable resin.

11. A light illuminating apparatus comprising multiple light illuminating modules, each of which is the light illuminating module defined in claim 1.

12. The light illumination module according to claim 1, wherein the convex part of each of the multiple lenses is exposed to an exterior.

13. The light illuminating module according to claim 9, wherein the approximately circular, approximately elliptical or approximately polygonal shape, when viewed in the direction of the optical axis, is entirely disposed within the outer periphery of each lens.

* * * * *